US008664351B2

(12) United States Patent
Nozawa et al.

(10) Patent No.: US 8,664,351 B2
(45) Date of Patent: *Mar. 4, 2014

(54) BIAXIALLY ORIENTED POLYESTER FILM FOR BACKSHEET OF SOLAR BATTERIES

(75) Inventors: Koutarou Nozawa, Shiga-ken (JP); Taku Aoike, Shiga-ken (JP)

(73) Assignee: Mitsubishi Plastics, Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/519,234

(22) PCT Filed: Jan. 13, 2011

(86) PCT No.: PCT/JP2011/050416

§ 371 (c)(1),
(2), (4) Date: Sep. 19, 2012

(87) PCT Pub. No.: WO2011/087043

PCT Pub. Date: Jul. 21, 2011

(65) Prior Publication Data

US 2013/0012665 A1    Jan. 10, 2013

(30) Foreign Application Priority Data

Jan. 15, 2010   (JP) ................................. 2010-006842

(51) Int. Cl.
*C08G 63/183* (2006.01)
*C08J 5/18* (2006.01)
*H01L 31/042* (2006.01)

(52) U.S. Cl.
USPC ...................... 528/308.1; 428/480; 136/256

(58) Field of Classification Search
USPC ............................................. 525/437
See application file for complete search history.

(56) References Cited

U.S. PATENT DOCUMENTS 2,823,421 A * 2/1958 Scarlett ...................... 264/216

FOREIGN PATENT DOCUMENTS

| EP | 2 262 000 A1 | 12/2010 | |
|----|--------------|---------|---|
| EP | 2262000 A1 * | 12/2010 | ............. H01L 31/04 |
| JP | 2004-43540 | 2/2004 | |
| JP | 2004043540 A * | 2/2004 | ............. C08G 63/86 |
| WO | WO 2009/123357 | 10/2009 | |

OTHER PUBLICATIONS

International Search Report for PCT/JP2011/050416 mailed Feb. 8, 2011.

* cited by examiner

*Primary Examiner* — Randy Gulakowski
*Assistant Examiner* — Christopher M Rodd
(74) *Attorney, Agent, or Firm* — Nixon & Vanderhye P.C.

(57) ABSTRACT

The present invention provides a biaxially oriented polyester film for a backsheet of solar batteries which exhibits a good hydrolysis resistance and a low haze. The present invention relates to a biaxially oriented polyester film for a backsheet of solar batteries, comprising titanium in an amount of not more than 20 ppm in terms of a titanium atom, phosphorus in an amount of not more than 70 ppm in terms of a phosphorus atom, and antimony in an amount of not more than 10 ppm in terms of an antimony atom; and having a carboxyl end group content of not more than 26 equivalents/t and an intrinsic viscosity of 0.65 to 0.90.

11 Claims, No Drawings

BIAXIALLY ORIENTED POLYESTER FILM FOR BACKSHEET OF SOLAR BATTERIES

This application is the U.S. national phase of International Application No. PCT/JP2011/50416 filed 13 Jan. 2011 which designated the U.S. and claims priority to JP 2010-006842 filed 15 Jan. 2010, the entire contents of each of which are hereby incorporated by reference.

TECHNICAL FIELD

The present invention relates to a biaxially oriented polyester film for a backsheet of solar batteries which exhibits a good hydrolysis resistance and a low haze.

BACKGROUND ART

Solar power generation (photovoltaic power generation) in which a light energy is converted into an electric energy by a photoelectric transfer effect has been extensively used as a means for attaining a clean energy. With the recent enhancement in photoelectric transfer efficiency of solar batteries, solar power generation systems have been installed even in a large number of individual houses. In order to employ these solar power generation systems as a practical power source, there has been used a solar battery module having a plurality of solar battery cells which are electrically connected in series to each other.

Since the solar battery module is used under high-temperature and high-humidity environmental conditions for a long period of time, a film for a backsheet of solar batteries is also required to exhibit a long-term durability. For example, there has been proposed the technique in which a fluororesin-based film is used as the film for a backsheet of solar batteries (Patent Document 1). In the thus proposed technique, it is described that the fluororesin-based film is previously subjected to heat treatment to reduce a shrinkage factor of the fluororesin-based film, so that there can be obtained the effect of preventing deterioration in properties of the film including weather resistance and water resistance when subjected to vacuum lamination with ethylene vinyl acetate (hereinafter occasionally referred to merely as "EVA") as a sealing material as well as the effect of enhancing a yield of the film. However, since the fluororesin-based film is expensive, there tends to arise such a problem that a solar battery module produced using such a fluororesin-based film is also expensive.

Conventionally, there has been proposed the technique in which a polyester-based film is used as the film for a backsheet of solar batteries. However, as is known in the art, when using the polyester-based film under high-temperature and high-humidity environmental conditions, there tends to occur such a problem that the polyester-based film suffers from hydrolysis at an ester bond moiety in a molecular chain thereof, so that mechanical properties of the polyester-based film tend to be deteriorated. In consequence, in view of such a case that the polyester-based film is used outdoors over a long period of time (for example, over 20 years) or under high-humidity environmental conditions, there have been made various studies for suppressing occurrence of hydrolysis of the polyester.

It is known that the rate of hydrolysis of a polyester becomes higher as a content of a carboxyl end group in a molecular chain of the polyester is increased. Therefore, there has been proposed the technique in which by adding a compound capable of reacting with a carboxylic acid, the amount of a carboxyl group being present in a terminal end of a molecular chain of the polyester is reduced to thereby enhance a hydrolysis resistance of the polyester (Patent Documents 2 and 3). However, these compounds added tend to induce gelation of the polyester upon melt extrusion step or a material recycling step in a film formation process to thereby cause generation of foreign matters in the film, resulting in high burdens on environments and high product costs.

In addition, aside from the conventional concept that the solar batteries are disposed on roofs, there is recently an increasing demand for "solar batteries of a see-through type" which are designed to imagine a window glass. The solar batteries of such a type are capable of generating an electric power while ensuring a good outside view from an inside thereof. The film for a backsheet of the solar batteries of this type is required to have not only a long-term durability but also a low haze.

Upon polycondensation of a polyester as a raw material of the polyester film, antimony trioxide has been extensively used as a catalyst for the polycondensation reaction because it is inexpensive and exhibits an excellent catalytic activity. If the antimony trioxide is used as a main component of the polycondensation catalyst, i.e., added in such an amount as is capable of exhibiting a practical performance of the polymerization catalyst, the antimony trioxide tends to be reduced upon the polycondensation reaction, which results in production of metallic antimony particles. As a result, in the subsequent melt extrusion step for forming a film, the metallic antimony particles tend to be aggregated together and therefore present in the resulting film in the form of black foreign matters having a size of 20 to 50 μm. That is, there tends to remain such a problem that these aggregated metallic antimony particles inhibit penetration of light through the film and increase a haze of the film.

Even though a filter is used upon the melt extrusion step in order to remove the aggregated metallic antimony particles, it may be difficult to completely remove the particles because the aggregated metallic antimony particles tend to still pass through the filter while being deformed.

In addition, upon polycondensation of the polyester as a raw material of the base polyester film, a germanium compound has also been used as the polymerization catalyst. However, the germanium compound is very expensive, and therefore it may be difficult to generally use the germanium compound.

In order to solve the above conventional problems, there has been proposed the technique in which contents of a titanium compound and a phosphorus compound in a film are limited to specific ranges to reduce internal foreign matters in the resulting film (Patent Document 4). However, in the above proposed technique, any oligomers which tend to be generated upon a melt polymerization step for production of a polyester have not been taken at all into consideration. That is, in the above technique, the oligomers tend to be generated inside of the resulting film or on a surface of the film, and it may be therefore difficult to obtain a film having a low haze.

PRIOR DOCUMENTS

Patent Documents

Patent Document 1: Japanese Patent Application Laid-Open (KOKAI) No. 2002-83978
Patent Document 2: Japanese Patent Application Laid-Open (KOKAI) No. 9-227767
Patent Document 3: Japanese Patent Application Laid-Open (KOKAI) No. 8-73719

Patent Document 4: Japanese Patent Application Laid-Open (KOKAI) No. 6-170911

SUMMARY OF THE INVENTION

Problems to be Solved by the Invention

The present invention has been accomplished to solve the above problems. An object of the present invention is to provide a biaxially oriented polyester film for sealing a back surface (backsheet) of solar batteries which exhibits a good hydrolysis resistance and a low haze.

Means for Solving Problems

As a result of the present inventors' earnest study, it has been found that the above problems can be solved by using a polyester film having a specific structure. The present invention has been attained on the basis of this finding.

That is, according to the present invention, there is provided a biaxially oriented polyester film for a backsheet of solar batteries, comprising titanium in an amount of not more than 20 ppm in terms of a titanium atom, phosphorus in an amount of not more than 70 ppm in terms of a phosphorus atom, and antimony in an amount of not more than 10 ppm in terms of an antimony atom; and having a carboxyl end group content of not more than 26 equivalents/t and an intrinsic viscosity of 0.65 to 0.90.

Effect of the Invention

In accordance with the present invention, there is provided a biaxially oriented polyester film for a backsheet of solar batteries which exhibits a good hydrolysis resistance and a low haze. Therefore, the present invention has a high industrial value.

PREFERRED EMBODIMENTS FOR CARRYING OUT THE INVENTION

The present invention is described in more detail below.

The polyester film as used in the present invention means a film which may be obtained by melt-extruding a polyester from an extrusion die by a so-called extrusion method and then cooling the thus extruded molten polyester sheet, followed by stretching the sheet, if required.

In the present invention, the polyester used in the polyester film means a polymer obtained by subjecting an aromatic dicarboxylic acid and an aliphatic glycol to polycondensation reaction. Examples of the aromatic dicarboxylic acid include terephthalic acid and 2,6-naphthalenedicarboxylic acid. Examples of the aliphatic glycol include ethylene glycol, diethylene glycol and 1,4-cyclohexanedimethanol. Typical examples of the polyesters include polyethylene terephthalate (PET) and polyethylene-2,6-naphthalene dicarboxylate (PEN). Among these polyesters, preferred is polyethylene terephthalate (PET).

As to the amounts of the respective compounds in the polyester film according to the present invention, it is required that the contents of titanium, phosphorus and antimony in the polyester film respectively fall within the specific ranges when analyzed and detected using the below-mentioned X-ray fluorescence analyzer.

Titanium being present in the film of the present invention is derived from a catalyst used for production thereof, and it is required that the content of titanium in the film is not more than 20 ppm. The titanium content in the film is preferably not more than 15 ppm, more preferably not more than 12 ppm and especially preferably not more than 9 ppm. The lower limit of the titanium content in the film is not particularly limited, but is actually about 2 ppm as far as the current techniques are concerned. When the titanium content is excessively large, oligomers as by-products tend to be produced upon the step of melt-extruding the polyester, so that the resulting film tends to exhibit an increased haze owing to the oligomers produced. As a result, the obtained film tends to be unsuitable as a polyester film for a backsheet of the see-through type solar batteries. On the other hand, when the film comprises no titanium element, the productivity upon production of the polyester raw material tends to be lowered so that it may be difficult to obtain a polyester raw material having a polymerization degree as aimed.

Examples of the titanium compound used as the catalyst include titanium alkoxides such as tetra-n-propyl titanate, tetra-i-propyl titanate, tetra-n-butyl titanate, a tetra-n-butyl titanate tetramer, tetra-t-butyl titanate, tetracyclohexyl titanate, tetraphenyl titanate and tetrabenzyl titanate, titanium oxides obtained by hydrolysis of the titanium alkoxides, composite oxides of titanium and silicon or zirconium which are obtained by hydrolysis of a mixture of the titanium alkoxide with a silicon alkoxide or a zirconium alkoxide, titanium acetate, titanium oxalate, potassium titanium oxalate, sodium titanium oxalate, potassium titanate, sodium titanate, a mixture of titanic acid and aluminum hydroxide, titanium chloride, a mixture of titanium chloride and aluminum chloride, titanium bromide, titanium fluoride, potassium titanate hexafluoride, cobalt titanate hexafluoride, manganese titanate hexafluoride, ammonium titanate hexafluoride and titanium acetyl acetonate. Among these titanium compounds, preferred are titanium alkoxides such as tetra-n-propyl titanate, tetra-i-propyl titanate and tetra-n-butyl titanate, titanium oxalate and potassium titanium oxalate, and especially preferred is tetra-n-butyl titanate.

The phosphorus element in the film of the present invention is derived from a co-catalyst and generally derived from a phosphoric acid compound which is added upon production of the polyester. In the present invention, it is required that the content of the phosphorus element in the polyester component falls within the range of not more than 70 ppm. The phosphorus element content in the film is preferably in the range of not more than 50 ppm and more preferably not more than 30 ppm. The lower limit of the phosphorus element content in the film is not particularly limited, and actually about 3 ppm as far as the current techniques are concerned. When the phosphorus element content in the film is excessively large, undesirable gelation tends to be caused upon formation of the film, so that the resulting film tends to be deteriorated in quality owing to inclusion of foreign matters therein, or undesirable hydrolysis of the thus formed film tends to be accelerated. Meanwhile, by incorporating the phosphorus compound together with a specific amount of the above titanium compound, it is possible to exhibit a remarkable effect of reducing a content of oligomers in the film.

Examples of the phosphoric acid compound include known compounds such as phosphoric acid, phosphorous acid or esters thereof, phosphonic acid compounds, phosphinic acid compounds, phosphonous acid compounds, and phosphinous acid compounds. Specific examples of the phosphoric acid compound include orthophosphoric acid, dimethyl phosphate, trimethyl phosphate, diethyl phosphate, triethyl phosphate, dipropyl phosphate, tripropyl phosphate, dibutyl phosphate, tributyl phosphate, diamyl phosphate, triamyl phosphate, dihexyl phosphate, trihexyl phosphate, diphenyl phosphate, triphenyl phosphate and ethyl acid phosphate.

Antimony included in the film of the present invention is derived from the catalyst, and it is required that the content of antimony in the film is not more than 10 ppm. The antimony content in the film is preferably not more than 8 ppm and more preferably not more than 5 ppm. As the antimony-containing catalyst for polyester films, there has been extensively mainly used antimony trioxide. When the antimony content in the film is more than 10 ppm in terms of an antimony element, the resulting film tends to be increased in haze.

In the polyester film obtained according to the present invention, the carboxyl end group content in the polyester constituting the film is not more than 26 equivalents/t and preferably not more than 24 equivalents/t. When the carboxyl end group content in the polyester is more than 26 equivalents/t, the polyester component tends to be deteriorated in hydrolysis resistance. The lower limit of the carboxyl end group content in the polyester component is not particularly limited. However, from the viewpoints of polycondensation reaction efficiency and thermal decomposition in the melt extrusion step, etc., the lower limit of the carboxyl end group content in the polyester component is usually about 5 equivalents/t.

The intrinsic viscosity of the polyester film according to the present invention is not less than 0.65 dL/g, and preferably not less than 0.68 dL/g. When the intrinsic viscosity of the polyester film is not less than 0.65 dL/g, it is possible to obtain a film exhibiting a good long-term durability and a good hydrolysis resistance. On the other hand, the upper limit of the intrinsic viscosity of the polyester film is not particularly limited. However, from the viewpoints of enhancing a polycondensation reaction efficiency and suppressing increase in pressure upon the melt extrusion step, the upper limit of the intrinsic viscosity of the polyester film is about 0.90 dL/g.

The polyester film of the present invention preferably comprises fine particles in order to enhance a workability upon subjecting the film to take-up step, coating step, deposition step, etc. Examples of the fine particles include inorganic particles such as particles of silica, calcium carbonate, magnesium carbonate, calcium sulfate, barium sulfate, lithium phosphate, magnesium phosphate, calcium phosphate, lithium fluoride, aluminum oxide, kaolin and the like; organic particles such as particles of acrylic resins, guanamine resins and the like; and precipitated particles obtained by forming residues of the catalyst into a particle shape, although not particularly limited thereto. Among these fine particles, preferred are porous silica particles as aggregated particles of primary particles of the silica particles. The porous silica particles are capable of preventing occurrence of voids therearound when stretching a film comprising the particles, so that the resulting film can be enhanced in transparency.

The average particle diameter of the primary particles constituting the porous silica particles is preferably in the range of 0.001 to 0.1 μm. When the average particle diameter of the primary silica particles is less than 0.001 μm, the primary silica particles tend to be deaggregated in a slurry-forming stage to thereby produce ultrafine particles. The thus produced ultrafine particles tend to form aggregates thereof, so that the resulting film tends to undesirably exhibit a high haze. On the other hand, when the average particle diameter of the primary silica particles is more than 0.1 μm, the obtained particles tend to have no porosity and, as a result, tend to lose their feature of the less occurrence of voids.

In addition, the pore volume of the aggregated particles of the silica particles is in the range of 0.5 to 2.0 mL/g, and preferably 0.6 to 1.8 mL/g. When the pore volume of the aggregated particles of the silica particles is less than 0.5 mL/g, the obtained particles tend to have no porosity and suffer from occurrence of voids, so that the resulting film tends to be deteriorated in transparency. When the pore volume of the aggregated particles of the silica particles is more than 2.0 mL/g, the obtained particles tend to be deaggregated, and the thus deaggregated particles tend to be aggregated together, so that it may be difficult to control the particle diameter thereof.

The method of adding the particles to the polyester film of the present invention is not particularly limited, and any conventionally known methods may be suitably used in the present invention. For example, the particles may be added in any optional stage of the production process of the polyester. The particles are preferably added in an esterification stage or in a stage after completion of transesterification reaction and before initiation of polycondensation reaction. In the latter case, the particles may be added in the form of a slurry prepared by dispersing the particles in ethylene glycol, etc., to allow the polycondensation reaction to proceed. In addition, there may also be used the method of blending a slurry prepared by dispersing the particles in ethylene glycol or water with the polyester raw material using a vented extruder, a method of blending the dried particles with the polyester raw material using a kneading extruder, and the like.

Also, in order to suppress occurrence of thermal decomposition or hydrolysis, the content of a metal compound in the film which may act as a catalyst is preferably adjusted to as small a level as possible. On the other hand, for the purpose of enhancing a productivity of the film, metals such as magnesium, calcium, lithium and manganese may be incorporated in an amount of usually not more than 300 ppm and preferably not more than 250 ppm in the polyester component to reduce a volume resistivity thereof upon melting.

Meanwhile, in the polyester film of the present invention, in addition to the above particles, various conventionally known additives such as an antioxidant, a thermal stabilizer, a lubricant, an antistatic agent and a dye may be added thereto, if required. Also, for the purpose of enhancing a weather resistance, an ultraviolet absorber may be added to the polyester film in an amount of 0.01 to 5.0 parts by weight based on the weight of the polyester component. In particular, a benzoxazinone-based ultraviolet absorber and the like are preferably used.

The thickness of the polyester film according to the present invention is not particularly limited as long as it lies within the range capable of forming a film shape, and is usually in the range of 10 to 500 μm, preferably 15 to 400 μm and more preferably 20 to 300 μm.

In the present invention, using two or three or more melting extruders, it is possible to produce a multi-layer film having two layers or three or more layers by a so-called co-extrusion method. As the layer structure of the resulting multi-layer film, there may be mentioned a layer structure of A/B or A/B/A using a raw material A and a raw material B, a layer structure of A/B/C further using a raw material C, and the other layer structures.

In the following, the process for producing the polyester film according to the present invention is more specifically explained. However, the following production process is only illustrative and not intended to limit the present invention thereto, and the other modification and changes are also possible as long as they can meet with the scope of the present invention.

That is, polyester chips (polyester components) which are dried by known methods or kept undried are fed to a kneading extruder and heated to a temperature not lower than a melting point of the respective polyester components for melting the polyester chips. Then, the thus obtained molten polyesters are extruded through a die onto a rotary cooling drum and rapidly cooled to a temperature not higher than a glass transition temperature thereof and solidified, thereby obtaining a substantially amorphous non-oriented sheet. In this case, in order to enhance a flatness or surface smoothness of the sheet, it is preferred to improve pinning properties of the sheet to the rotary cooling drum. For this purpose, in the present invention, an electrostatic pinning method and/or a liquid coating adhesion method are preferably used. Even in the melt extrusion step, the carboxyl end group content in the polyester tends to be increased depending upon the conditions used. Therefore, in the present invention, there are preferably adopted a method of shortening a residence time of the polyester in the extruder during the extrusion step, a method of previously drying the raw material to a sufficient extent such that the water content therein is preferably controlled to not more than 50 ppm and more preferably not more than 30 ppm in the case of using a single-screw extruder, a method of providing a vent port on a twin-screw extruder to maintain an inside of the extruder at a reduced pressure of not more than 40 hPa, preferably not more than 30 hPa and more preferably not more than 20 hPa, etc.

In the present invention, the thus obtained sheet is biaxially stretched to form a film. More specifically, the stretching may be conducted under the following conditions. That is, the unstretched sheet is preferably stretched in a longitudinal direction thereof at a temperature of 70 to 145° C. and a draw ratio of 2 to 6 times to form a longitudinally monoaxially stretched film, and then the monoaxially stretched film is stretched in a lateral direction thereof at a temperature of 90 to 160° C. and a draw ratio of 2 to 6 times to form a biaxially stretched film. The resulting biaxially stretched film is further subjected to heat-setting step.

The heat-setting is preferably accomplished by subjecting the polyester film to heat treatment at a temperature of 160 to 240° C. for 1 to 600 sec. The heat treatment is more preferably carried out at a temperature of 170 to 230° C. When the heat-setting temperature is lower than 160° C., the shrinkage factor of the polyester film in a longitudinal direction thereof tends to be excessively high, and the polyester film therefore tends to be subjected to annealing treatment under very severe conditions, so that the resulting film tends to be practically unused owing to occurrence of severe distortion. On the other hand, when the heat-setting temperature is higher than 240° C., the resulting polyester film may fail to exhibit a good hydrolysis resistance.

The hydrolysis resistance of the polyester film is a property relating to a whole portion of the film. In the present invention, in the case of the film having a laminated structure which is produced by the co-extrusion method, it is required that the antimony, titanium and phosphorus contents, the carboxyl end group content and the intrinsic viscosity of the polyester component constituting the film as a whole respectively fall within the above-specified ranges.

In the present invention, in order to control the carboxyl end group content in the polyester component in the polyester film to the specific range, the residence time of the polyester component, for example, in an extruder used in an extrusion step of polyester chips, is shortened to thereby obtain the polyester film as aimed. In addition, polyester chips having a low carboxyl end group content may be formed into a film shape to obtain the polyester film whose carboxyl end group content lies within the above-specified range. Further, when a reclaimed raw material obtained through a melting step is compounded into the above polyester raw material upon production of the film, the carboxyl end group content in the polyester component tends to be increased out of the above-specified range. Therefore, in the present invention, none of such a reclaimed raw material is preferably compounded, and even if compounded, the reclaimed raw material is preferably added in an amount of not more than 40% by weight and more preferably not more than 20% by weight.

In the present invention, during or after the above stretching step, in order to impart an adhesion property, an antistatic property, a slip property, a releasing property, etc., to the film, a coating layer may be formed on one or both surfaces of the film, or the film may be subjected to discharge treatment such as corona treatment.

EXAMPLES

The present invention is described in more detail below by the following Examples. However, these Examples are only illustrative and not intended to limit the present invention thereto, and other variations and modifications are possible unless they depart from the scope of the present invention. Meanwhile, the methods for measuring and evaluating various properties of the film are as follows.

(1) Quantitative Determination of Respective Atoms Derived from Catalyst:

Using an X-ray fluorescence analyzer "XRF-1800" manufactured by Shimadzu Corp., the amounts of the respective atoms in the film were determined by a single sheet measurement method under the conditions shown in Table 1 below. In the case of a multi-layer film, the film was melted and molded into a disk shape to measure contents of an antimony atom (Sb), a titanium atom (Ti) and a phosphorus atom (P) based on a whole amount of the film.

TABLE 1

| | Sb | Ti | P |
|---|---|---|---|
| X-ray tube target | Rh 4.0 kW | Rh 4.0 kW | Rh 4.0 kW |
| Voltage (kV) | 40 | 40 | 40 |
| Current (mA) | 95 | 95 | 95 |
| Analyzing crystal | LiF | LiF | Ge |
| Detector | FPC | SC | FPC |
| 2θ (deg: °) | 117.34 | 86.14 | 141.03 |
| Measuring time (sec); two-point background; 20 sec for each | 40.0 | 40.0 | 40.0 |

(2) Carboxyl End Group Content (AV) (Equivalent/T):

The polyester chips were milled and then dried at 140° C. for 15 min using a hot air dryer, and further cooled to room temperature in a desiccator to prepare a sample. The thus prepared sample was accurately weighed in an amount of 0.1 g and placed in a test tube. The test tube was further charged with 3 mL of benzyl alcohol, and the contents of the test tube were dissolved at 195° C. for 3 min while blowing a dry nitrogen gas thereinto. Next, 5 mL of chloroform were gradually added to the resulting solution, and the contents of the test tube were cooled to room temperature. One or two droplets of a phenol red indicator were added to the above solution, and the solution was subjected to titration using a 0.1 N (normality) sodium hydroxide benzyl alcohol solution under stirring while blowing a dry nitrogen gas thereinto. The titration was terminated at the time at which the color of the solution was changed from yellow to red. In addition, the above materials except for the polyester resin sample as a blank were subjected to the same procedure as defined above to calculate an acid value of the polyester according to the following formula.

$$\text{Acid value(equivalent}/t) = (A-B) \times 0.1 \times f/W$$

wherein A is an amount (μL) of the 0.1 N sodium hydroxide benzyl alcohol solution used in titration of the polyester resin sample; B is an amount (μL) of the 0.1 N sodium hydroxide benzyl alcohol solution used in titration of the blank; W is an amount (g) of the polyester resin sample; and f is a titer of the 0.1 N sodium hydroxide benzyl alcohol solution.

Meanwhile, the titer (f) of the 0.1 N sodium hydroxide benzyl alcohol solution was measured as follows. That is, 5 mL of methanol was sampled in a test tube, and one or two droplets of a phenol red ethanol solution as an indicator were added to the test tube, and the resulting solution was subjected to titration using 0.4 mL of a 0.1 N sodium hydroxide benzyl alcohol solution until reaching a point at which a color of the solution was changed. Next, 0.2 mL of a 0.1 N hydrochloric acid aqueous solution as a standard solution having a known titer was sampled and subjected again to titration using the 0.1 N sodium hydroxide benzyl alcohol solution until reaching a point at which a color of the solution was changed (the above procedures were conducted while blowing a dry nitrogen gas into the solution). The titer (f) was calculated according to the following formula.

$$\text{Titer}(f) = (\text{titer of the 0.1 N hydrochloric acid aqueous solution}) \times (\text{amount}(\mu L) \text{ of 0.1 N hydrochloric acid aqueous solution sampled})/(\text{amount}(\mu L) \text{ of the 0.1 N sodium hydroxide benzyl alcohol solution used in the titration})$$

(3) Intrinsic Viscosity (IV) (dL/g):

The polyester film was dissolved in a mixed solvent comprising phenol and tetrachloroethane at a weight ratio of 50/50. The resulting solution having a concentration of 1.0 (g/dL) was subjected to measurement of a falling time thereof using a capillary tube viscometer, and the solvent only was also subjected to the same measurement of a falling time thereof. The intrinsic viscosity of the polyester was calculated from a ratio between the falling times according to a Huggins' formula in which a Huggins' constant was assumed to be 0.33.

(4) Hydrolysis Resistance Test:

Using a personal pressure cooker (manufactured by Hirayama Manufacturing Corp.), the polyester film was treated in an atmosphere of 120° C. and 100% RH for 72 hr. Next, using "AUTOGRAPH AG-1" manufactured by Shimadzu Corp., an elongation at break of the film in a film-forming direction (MD direction) thereof as mechanical properties of the film was measured at a rate of 200 mm/min. The retention rate (%) of the elongation at break between before and after the above treatment was calculated from the following formula, and the hydrolysis resistance of the film was evaluated according to the following ratings.

Retention rate(%) of elongation at break=(elongation at break after treatment)÷(elongation at break before treatment)×100

A: The retention rate was not less than 50%;
B: The retention rate was not less than 5% and less than 50%; and
C: The retention rate was less than 5%.

(5) Haze:

Using a haze meter "NDH-300A" manufactured by Nippon Denshoku Industries Co., Ltd., the 50 μm-thick film was subjected to measurement of a haze (H). From the relationship with a weight fraction of silica contained in the film, the haze of the film was evaluated according to the following ratings.

A: H≤0.004φ
C: H>0.000φ wherein φ is a weight fraction (ppm) of silica contained in the film.

(6) Total Evaluation:

The evaluation ratings of hydrolysis resistance and haze were compared with each other, and the worse evaluation rating was regarded as the total evaluation (for example, when the evaluation rating of hydrolysis resistance is "A" and the evaluation rating of haze is "C", the total evaluation is regarded as being "C").

<Method for Production of Polyester (1)>

A slurry preparation vessel was connected in series to two-stage esterification reaction vessels of which the second-stage esterification reaction vessel was in turn connected in series to three-stage melt-polycondensation reaction vessels to thereby provide a continuous polymerization apparatus. The slurry preparation vessel was continuously charged with terephthalic acid and ethylene glycol at feed rates of 865 parts by weight and 485 parts by weight, respectively, and further a 0.3 wt % ethylene glycol solution of ethyl acid phosphate was continuously added thereto at such a feed rate that the content of phosphorus atom per 1 ton of the resulting polyester resin was 0.129 mouton of the resin, and then stirred and mixed therewith to thereby prepare a slurry. The thus prepared slurry was continuously delivered to the first-stage esterification reaction vessel which was held at a temperature of 260° C. under a relative pressure of 50 kPa (0.5 kg/cm$^2$) in a nitrogen atmosphere and in which an average residence time of the slurry was adjusted to 4 hr, and then to the second-stage esterification reaction vessel which was held at a temperature of 260° C. under a relative pressure of 5 kPa (0.05 kg/cm$^2$) in a nitrogen atmosphere and in which an average residence time of the slurry was adjusted to 1.5 hr, to thereby subject the slurry to esterification reaction. Upon the esterification reaction, a 0.6 wt % ethylene glycol solution of magnesium acetate tetrahydrate was continuously added to the reaction solution through an upper conduit fitted to the second-stage esterification reaction vessel at such a feed rate that the content of magnesium atom per 1 ton of the resulting polyester resin was 0.165 mol/ton of the resin, and further an additional amount of ethylene glycol was continuously added to the reaction solution through a separate upper conduit fitted to the second-stage esterification reaction vessel at a feed rate of 60 parts by weight per hour.

Successively, the thus obtained esterification reaction product was continuously delivered to the melt polycondensation reaction vessels. Upon the delivery, while continuously adding an ethylene glycol solution of tetra-n-butyl titanate whose titanium atom concentration and water concentration were adjusted to 0.15% by weight and 0.5% by weight, respectively, to the esterification reaction product delivered through a transport conduit at such a feed rate that the content of titanium atom per 1 ton of the resulting polyester resin was 0.084 mol/ton of the resin, the esterification reaction product was continuously delivered to the first-stage melt polycondensation reaction vessel set to a temperature of 270° C. and an absolute pressure of 2.6 kPa and then to the second-stage melt polycondensation reaction vessel set to a temperature of 278° C. and an absolute pressure of 0.5 kPa, and further to the third-stage melt polycondensation reaction vessel set to a temperature of 280° C. and an absolute pressure of 0.3 kPa. The melt polycondensation reaction was conducted while controlling the residence times in the respective polycondensation reaction vessels such that the intrinsic viscosity of the resulting polyester resin was 0.65 (dL/g). The obtained polycondensation reaction product was continuously withdrawn into a strand shape from a discharge port provided on a bottom of the polycondensation reaction vessel, cooled with water, and cut using a cutter, thereby obtaining a polyester (1) in the form of chip-like particles. As a result, it was confirmed that the carboxyl end group content in the thus obtained polyester (1) was 12 (equivalent/t).

<Method for Production of Polyester (2)>

The polyester (1) as a starting material was continuously fed into a stirring crystallization device held at a temperature of about 160° C. in a nitrogen atmosphere such that the residence time of the staring material in the device was about 60 min, and crystallized therein. Thereafter, the thus crystallized polyester was continuously fed into a column-type solid state polycondensation apparatus and then subjected to solid state polycondensation reaction at 215° C. in a nitrogen atmosphere while controlling a residence time of the polyester therein such that the intrinsic viscosity of the resulting polyester resin was 0.75 dL/g, thereby obtaining a polyester (2). As a result, it was confirmed that the carboxyl end group content in the thus obtained polyester (2) was 8 equivalents/t.

<Method for Production of Polyester (3)>

A reaction vessel was charged with 100 parts by weight of dimethyl terephthalate and 60 parts by weight of ethylene glycol as starting materials as well as 0.09 part by weight of calcium acetate as a catalyst, and the reaction temperature in the reaction vessel was gradually raised from 150° C. as a reaction initiation temperature while distilling off methanol as produced until reaching 230° C. after 3 hr.

After the elapse of 4 hr, the transesterification reaction was substantially terminated. The resulting reaction mixture was mixed with 0.04 part by weight of antimony trioxide and silica particles having an average particle diameter of 2.5 μm in the form of a dispersion in ethylene glycol in an amount of 0.06% by weight based on the polyester, and the resulting mixture was subjected to polycondensation reaction for 4 hr. That is, in the above polycondensation reaction, the reaction temperature was gradually raised from 230° C. and finally allowed to reach 280° C. On the other hand, the reaction pressure was gradually dropped from normal pressures and finally allowed to reach 40 Pa. After initiation of the reaction, the change in agitation power in the reaction vessel was monitored, and the reaction was terminated at the time at which the agitation power reached the value corresponding to an intrinsic viscosity of 0.60 dL/g. The resulting polymer was withdrawn from the reaction vessel under application of a nitrogen pressure. Successively, the resulting polyester was subjected to solid state polymerization under vacuum at 220° C., thereby obtaining a polyester (3). As a result, it was confirmed that the thus obtained polyester (3) had an intrinsic viscosity of 0.75 dL/g and a carboxyl end group content of 9 equivalents/t.

<Method for Production of Polyester (4)>

A reaction vessel was charged with 100 parts by weight of dimethyl terephthalate and 60 parts by weight of ethylene glycol as starting materials as well as tetra-n-butyl titanate as a catalyst in such an amount that the content of titanium atom per 1 ton of the resulting polyester resin was 5 g/ton of the resin, and the reaction temperature in the reaction vessel was gradually raised from 150° C. as a reaction initiation temperature while distilling off methanol as produced until reaching 230° C. after 3 hr. After the elapse of 4 hr, the transesterification reaction was substantially terminated. The resulting reaction mixture was transferred into a polycondensation vessel, and a slurry prepared by dispersing silica particles having an average particle diameter of 2.5 μm in ethylene glycol was added thereto in such an amount that the content of the silica particles therein was 1.5% by weight based on the polyester. The resulting mixture was subjected to polycondensation reaction for 4 hr. That is, in the above polycondensation reaction, the reaction temperature was gradually raised from 230° C. and finally allowed to reach 280° C. On the other hand, the reaction pressure was gradually dropped from normal pressures and finally allowed to reach 0.3 mmHg. After initiation of the reaction, the change in agitation power in the reaction vessel was monitored, and the reaction was terminated at the time at which the agitation power reached the value corresponding to an intrinsic viscosity of 0.60. The resulting polymer was withdrawn from the reaction vessel under application of a nitrogen pressure, thereby obtaining a polyester (4). As a result, it was confirmed that the thus obtained polyester (4) had an intrinsic viscosity of 0.60 dL/g and a carboxyl end group content of 21 equivalents/t.

<Method for Production of Polyester (5)>

A slurry comprising 43 parts by weight of terephthalic acid and 19 parts by weight of ethylene glycol was sequentially fed to an esterification reaction vessel previously filled with 50 parts by weight of bis(hydroxyethyl)terephthalate which was held at 250° C. under a relative pressure of $1.2 \times 10^5$ Pa, over 4 hr. After completion of the feeding, the esterification reaction was further carried out over 1 hr. The obtained esterification reaction product was delivered to a polycondensation vessel.

The above polycondensation vessel to which the esterification reaction product had been delivered was sequentially charged with orthophosphoric acid and germanium dioxide each used in the form of an ethylene glycol solution at intervals of 5 min. Meanwhile, the orthophosphoric acid was added in such an amount that the content of phosphorus atom therein was 32.2 mol per 1 ton of the resin, whereas the germanium dioxide was added in such an amount that the content of germanium atom therein was 0.6 mol per 1 ton of the resin. Thereafter, the temperature in the reaction system was raised from 225° C. to 280° C. over 2 hr and 30 min, whereas the pressure therein was dropped from normal pressures to 400 Pa (absolute pressure) over 85 min. While keeping the reaction system under the same pressure, the reaction was terminated at the time at which the condition reached the value corresponding to an intrinsic viscosity of 0.63 (dL/g). The resulting polymer was withdrawn from the reaction vessel under application of a nitrogen pressure, thereby obtaining a polyester (5). As a result, it was confirmed that the thus obtained polyester (5) had an intrinsic viscosity of 0.63 (dL/g) and a carboxyl end group content of 51 (equivalents/t).

<Method for Production of Polyester (6)>

A reaction vessel was charged with 100 parts by weight of dimethyl terephthalate and 60 parts by weight of ethylene glycol as starting materials as well as tetra-n-butyl titanate as a catalyst in such an amount that the content of titanium atom per 1 ton of the resulting polyester resin was 5 g/ton of the resin, and the reaction temperature in the reaction vessel was gradually raised from 150° C. as a reaction initiation temperature while distilling off methanol as produced until reaching 230° C. after 3 hr. After the elapse of 4 hr, the transesterification reaction was substantially terminated. The resulting reaction mixture was transferred into a polycondensation vessel, and a slurry prepared by dispersing silica particles having an average particle diameter of 2.5 μm in ethylene glycol was added thereto in such an amount that the content of the silica particles therein was 0.06% by weight based on the polyester. The resulting mixture was subjected to polycondensation reaction for 4 hr. That is, in the above polycondensation reaction, the reaction temperature was gradually raised from 230° C. and finally allowed to reach 280° C. On the other hand, the reaction pressure was gradually dropped from normal pressures and finally allowed to reach 0.3 mmHg. After initiation of the reaction, the change in agitation power in the reaction vessel was monitored, and the reaction was terminated at the time at which the agitation power reached the value corresponding to an intrinsic viscosity of 0.55 (dL/g). The resulting polymer was withdrawn from the reaction vessel under application of a nitrogen pressure, thereby obtaining polyester chips. Successively, the thus obtained polyester chips were subjected to solid state polymerization under vacuum at 220° C., thereby obtaining a polyester (6). As a result, it was confirmed that the thus obtained polyester (6) had an intrinsic viscosity of 0.75 dL/g and a carboxyl end group content of 25 equivalents/t.

<Method for Production of Polyester (7)>

The same procedure as defined in the above method for production of the polyester (6) was conducted except that tetra-n-butyl titanate was added in such an amount that the content of titanium atom per 1 ton of the resulting polyester resin was 15 g/ton of the resin, thereby obtaining a polyester (7). As a result, it was confirmed that the thus obtained polyester (7) had an intrinsic viscosity of 0.73 dL/g and a carboxyl end group content of 25 equivalents/t.

<Method for Production of Polyester (8)>

The same procedure as defined in the above method for production of the polyester (6) was conducted except that tetra-n-butyl titanate was added in such an amount that the content of titanium atom per 1 ton of the resulting polyester resin was 40 g/ton of the resin, thereby obtaining a polyester (8). As a result, it was confirmed that the thus obtained polyester (8) had an intrinsic viscosity of 0.71 dL/g and a carboxyl end group content of 27 equivalents/t.

<Method for Production of Polyester (9)>

The same procedure as defined in the above method for production of the polyester (6) was conducted except that no silica particles were added, thereby obtaining a polyester (9). As a result, it was confirmed that the thus obtained polyester (9) had an intrinsic viscosity of 0.77 dL/g and a carboxyl end group content of 23 equivalents/t.

Example 1

The above polyester (2) and polyester (4) were mixed with each other at a mixing ratio of 96:4 to obtain a polyester mixture as a raw material. The resulting polyester mixture was melted and extruded at 290° C. using a vented twin-screw extruder onto a casting drum whose surface temperature was maintained at 40° C. to rapidly cool and solidify the mixture by an electrostatic pinning method, thereby forming an unstretched single-layer sheet. The thus obtained sheet was stretched at 83° C. at a draw ratio of 3.3 times in a longitudinal direction thereof. Then, the resulting monoaxially stretched sheet was introduced into a tenter, and then stretched at 110° C. at a draw ratio of 3.7 times in a lateral direction thereof. The thus biaxially stretched sheet was further subjected to heat-setting treatment at 220° C., thereby obtaining a film having a thickness of 50 μm. The properties and evaluation results of the thus obtained film are shown in Table 2 below.

Example 2

The same procedure as defined in Example 1 was conducted except that the polyester raw materials in the mixture were replaced with a polyester mixture prepared by mixing the above polyester (2), polyester (4) and polyester (5) with each other at a mixing ratio of 91:4:5, thereby obtaining a film. The properties and evaluation results of the thus obtained film are shown in Table 2 below.

Example 3

The same procedure as defined in Example 1 was conducted except that the polyester raw materials in the mixture were replaced with a polyester mixture prepared by mixing the above polyester (2), polyester (4) and polyester (9) with each other at a mixing ratio of 31:4:65, thereby obtaining a film. The properties and evaluation results of the thus obtained film are shown in Table 2 below.

Example 4

The same procedure as defined in Example 1 was conducted except that the polyester raw materials in the mixture were replaced with a polyester mixture prepared by mixing the above polyester (2) and polyester (7) with each other at a mixing ratio of 50:50, thereby obtaining a film. The properties and evaluation results of the thus obtained film are shown in Table 2 below.

Example 5

The same procedure as defined in Example 1 was conducted except that the polyester raw materials in the mixture were replaced with a polyester mixture prepared by mixing the above polyester (2), polyester (3) and polyester (4) with each other at a mixing ratio of 95:1:4, thereby obtaining a film. The properties and evaluation results of the thus obtained film are shown in Table 2 below.

Example 6

The same procedure as defined in Example 1 was conducted except that the polyester raw materials in the mixture were replaced with a polyester mixture prepared by mixing the above polyester (2), polyester (4) and polyester (5) with each other at a mixing ratio of 94:4:2, thereby obtaining a film. The properties and evaluation results of the thus obtained film are shown in Table 2 below.

Comparative Example 1

The same procedure as defined in Example 1 was conducted except that the polyester raw materials in the mixture were replaced with a polyester mixture prepared by mixing the above polyester (1) and polyester (4) with each other at a mixing ratio of 96:4, thereby obtaining a film. The properties and evaluation results of the thus obtained film are shown in Table 3 below.

Comparative Example 2

The same procedure as defined in Example 1 was conducted except that the polyester raw materials in the mixture were replaced with the above polyester (6) solely, thereby obtaining a film. The properties and evaluation results of the thus obtained film are shown in Table 3 below.

Comparative Example 3

The same procedure as defined in Example 1 was conducted except that the polyester raw materials in the mixture were replaced with a polyester mixture prepared by mixing the above polyester (3) and polyester (5) with each other at a mixing ratio of 96:4, thereby obtaining a film. The properties and evaluation results of the thus obtained film are shown in Table 3 below.

Comparative Example 4

The same procedure as defined in Example 1 was conducted except that the polyester raw materials in the mixture were replaced with a polyester mixture prepared by mixing the above polyester (2), polyester (4) and polyester (5) with each other at a mixing ratio of 76:4:20, thereby obtaining a film. The properties and evaluation results of the thus obtained film are shown in Table 3 below.

Comparative Example 5

The same procedure as defined in Example 1 was conducted except that the polyester raw materials in the mixture were replaced with a polyester mixture prepared by mixing the above polyester (2) and polyester (8) with each other at a mixing ratio of 50:50, thereby obtaining a film. The properties and evaluation results of the thus obtained film are shown in Table 3 below.

Comparative Example 6

The same procedure as defined in Example 1 was conducted except that the polyester raw materials in the mixture were replaced with a polyester mixture prepared by mixing the above polyester (2), polyester (3) and polyester (4) with each other at a mixing ratio of 86:10:4, thereby obtaining a film. The properties and evaluation results of the thus obtained film are shown in Table 3 below.

TABLE 2

| | Examples | | | | | |
|---|---|---|---|---|---|---|
| | 1 | 2 | 3 | 4 | 5 | 6 |
| Polyester (1) | 0 | 0 | 0 | 0 | 0 | 0 |
| Polyester (2) | 96 | 91 | 31 | 50 | 95 | 94 |
| Polyester (3) | 0 | 0 | 0 | 0 | 1 | 0 |
| Polyester (4) | 4 | 4 | 4 | 0 | 4 | 4 |
| Polyester (5) | 0 | 5 | 0 | 0 | 0 | 2 |
| Polyester (6) | 0 | 0 | 0 | 0 | 0 | 0 |
| Polyester (7) | 0 | 0 | 0 | 50 | 0 | 0 |
| Polyester (8) | 0 | 0 | 0 | 0 | 0 | 0 |
| Polyester (9) | 0 | 0 | 65 | 0 | 0 | 0 |
| Sb [ppm] | 0 | 0 | 0 | 0 | 4 | 0 |
| Ti [ppm] | 4 | 4 | 5 | 10 | 4 | 4.0 |
| P [ppm] | 4 | 55 | 2 | 2 | 4 | 24 |
| Silica concentration [ppm] | 600 | 600 | 600 | 300 | 606 | 600 |
| AV [equivalent/t] | 14 | 16 | 23 | 22 | 14 | 4 |
| IV [dL/g] | 0.67 | 0.66 | 0.69 | 0.67 | 0.67 | 0.67 |
| Hydrolysis resistance | A | B | B | A | A | A |
| Evaluation of haze | A | A | A | A | A | A |
| Total evaluation | A | B | B | B | A | A |

TABLE 3

| | Comparative Examples | | | | | |
|---|---|---|---|---|---|---|
| | 1 | 2 | 3 | 4 | 5 | 6 |
| Polyester (1) | 96 | 0 | 0 | 0 | 0 | 0 |
| Polyester (2) | 0 | 0 | 0 | 76 | 50 | 86 |
| Polyester (3) | 0 | 0 | 96 | 0 | 0 | 10 |
| Polyester (4) | 4 | 0 | 0 | 4 | 0 | 4 |
| Polyester (5) | 0 | 0 | 4 | 20 | 0 | 0 |
| Polyester (6) | 0 | 100 | 0 | 0 | 0 | 0 |
| Polyester (7) | 0 | 0 | 0 | 0 | 0 | 0 |
| Polyester (8) | 0 | 0 | 0 | 0 | 50 | 0 |
| Polyester (9) | 0 | 0 | 0 | 0 | 0 | 0 |
| Sb [ppm] | 0 | 0 | 320 | 0 | 0 | 30 |
| Ti [ppm] | 4 | 5 | 0 | 3 | 22 | 4 |
| P [ppm] | 4 | 0 | 40 | 210 | 3 | 3 |
| Silica concentration [ppm] | 600 | 600 | 576 | 600 | 300 | 660 |
| AV [equivalent/t] | 17 | 30 | 16 | 22 | 23 | 14 |
| IV [dL/g] | 0.58 | 0.68 | 0.68 | 0.65 | 0.66 | 0.67 |
| Hydrolysis resistance | C | C | A | C | B | A |
| Evaluation of haze | A | A | C | C | C | C |
| Total evaluation | C | C | C | C | C | C |

INDUSTRIAL APPLICABILITY

The biaxially oriented polyester film obtained according to the present invention exhibits a good hydrolysis resistance and a low haze, and therefore is useful as a biaxially oriented polyester film for a backsheet of see-through type solar batteries.

The invention claimed is:

1. A biaxially oriented polyester film for a backsheet of solar batteries, consisting essentially of
   a polyester obtained by a step consisting of subjecting an aromatic dicarboxylic acid and an aliphatic glycol to polycondensation reaction,
   titanium in an amount of not more than 20 ppm in terms of a titanium atom,
   phosphorus in an amount of not more than 70 ppm in terms of a phosphorus atom, and
   antimony in an amount of not more than 10 ppm in terms of an antimony atom; and
   having a carboxyl end group content of not more than 26 equivalents/t and an intrinsic viscosity of 0.65 to 0.90 dL/g.

2. The biaxial oriented polyester film according to claim 1, wherein the intrinsic viscosity is not less than 0.68 dL/g.

3. The biaxial oriented polyester film according to claim 1 having the carboxyl end group content of not more than 24 equivalents/t.

4. The biaxial oriented polyester film according to claim 1 having the carboxyl end group content of not less than 5 equivalents/t.

5. The biaxial oriented polyester film according to claim 1 comprising titanium in an amount of not more than 15 ppm in terms of a titanium atom.

6. The biaxial oriented polyester film according to claim 1 comprising titanium in an amount of not more than 12 ppm in terms of a titanium atom.

7. The biaxial oriented polyester film according to claim 1 comprising titanium in an amount of not more than 9 ppm in terms of a titanium atom.

8. The biaxial oriented polyester film according to claim 1 comprising titanium in phosphorus in an amount of not more than 50 ppm in terms of a phosphorus atom.

9. The biaxial oriented polyester film according to claim 1 comprising titanium in phosphorus in an amount of not more than 30 ppm in terms of a phosphorus atom.

10. The biaxial oriented polyester film according to claim 1 comprising antimony in an amount of not more than 8 ppm in terms of an antimony atom.

11. The biaxial oriented polyester film according to claim 1 comprising antimony in an amount of not more than 5 ppm in terms of an antimony atom.

* * * * *